(12) United States Patent
Hovis et al.

(10) Patent No.: US 6,434,082 B1
(45) Date of Patent: Aug. 13, 2002

(54) CLOCKED MEMORY DEVICE THAT INCLUDES A PROGRAMMING MECHANISM FOR SETTING WRITE RECOVERY TIME AS A FUNCTION OF THE INPUT CLOCK

(75) Inventors: William Paul Hovis, Rochester, MN (US); Steven William Tomashot, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/805,420

(22) Filed: Mar. 13, 2001

(51) Int. Cl.[7] .................................................. G11C 8/00
(52) U.S. Cl. ........................................ 365/233; 365/203
(58) Field of Search .................................. 365/233, 203

(56) References Cited

U.S. PATENT DOCUMENTS 5,587,961 A * 12/1996 Wright et al. ............... 365/233
5,903,509 A * 5/1999 Ryan et al. .................. 365/233
6,185,141 B1 * 2/2001 Hoshita et al. .............. 365/203

* cited by examiner

Primary Examiner—Huan Hoang
(74) Attorney, Agent, or Firm—Martin & Associates, L.L.C.; Derek P. Martin

(57) ABSTRACT

A clocked memory device includes a programming mechanism that allows the write recovery time during a command with auto precharge enabled to be dynamically set to some function of the input clock. In the preferred embodiments, the programming mechanism includes a control register with programmable bits that allows specifying the write recovery time according to the bit values written to the control register. For example, write recovery time could be specified as a whole or fractional number of clock cycles. By specifying the write recovery time as a function of the clock that may be dynamically set, the clocked memory device may be used at its highest performance capabilities over a wide range of operating frequencies.

19 Claims, 14 Drawing Sheets

|  | tDAL=5 clks | |
| --- | --- | --- |
| Clock Period | tWR=2 clks | tRP=3 clks |
| 7.0 | 14 | 21 |
| 7.5 | 15 | 22.5 |
| 8.0 | 16 | 24 |
| 10 | 20 | 30 |
| 11 | 22 | 33 |
| 12 | 24 | 36 |
| 13 | 26 | 39 |
| 14 | 28 | 42 |
| 15 | 30 | 45 |

PC133 spans clock periods 7.0–8.0; PC100 spans clock periods 10–15.

FIG. 2    Prior Art

|  | tDAL=35 ns | |
|---|---|---|
| Clock Period | tWR=1 clk | tRP |
| 7.0 | 7.0 * | 28 |
| 7.5 | 7.5 * | 30 |
| 8.0 | 8.0 * | 32 |
| 10 | 10 * | 30 |
| 11 | 11 * | 33 |
| 12 | 12 * | 24 |
| 13 | 13 * | 26 |
| 14 | 14 * | 28 |
| 15 | 15 | 30 |

\* = Design points where yield loss is expected

FIG. 6  Prior Art

|  | tDAL=35 ns | |
|---|---|---|
| Timer Delay | tWR | tRP |
| 10 | 10 * | 25 |
| 11 | 11 * | 24 |
| 12 | 12 * | 23 |
| 13 | 13 * | 22 |
| 14 | 14 * | 21 |
| 15 | 15 | 20 |
| 16 | 16 | 19 |
| 17 | 17 | 18 |
| 18 | 18 | 17 |
| 19 | 19 | 16 |
| 20 | 20 | 15 |

* = Design points where yield loss is expected

FIG. 8    Prior Art

EMRS Register for DDR SDRAM

| A0 | A1 | A2 | A3 | A4 | A5 | A6 | A7 | A8 | A9 | A10 | A11 | A12 | BA0 | BA1 |
|---|---|---|---|---|---|---|---|---|---|---|---|---|---|---|
| DLL | DS | QFC | WR0 | WR1 | 0 | 0 | 0 | 0 | 0 | 0 | 0 | 0 | 1 | 0 |

FIG. 11

| A0 | DLL |
|---|---|
| 0 | Enable |
| 1 | Disable |

FIG. 12

| A1 | Drive Strength |
|---|---|
| 0 | Normal |
| 1 | Weak |

FIG. 13

| A2 | QFC |
|---|---|
| 0 | Disable |
| 1 | Enable |

FIG. 14

| A4-A3 | tWR |
|---|---|
| 00 | 2 cycles |
| 01 | 3 cycles |
| 10 | 4 cycles |
| 11 | 5 cycles |

FIG. 15

| BA1-BA0 | An-A5 | A4-A0 | Operating Mode |
|---|---|---|---|
| 01 | 0 | Valid | Normal Operation |
| 01 | - | | All other states reserved |

FIG. 16

EMRS Register for DDR II SDRAM

| A0 | A1 | A2 | A3 | A4 | A5 | A6 | A7 | A8 | A9 | A10 | A11 | A12 | BA0 | BA1 |
|----|----|----|----|----|----|----|----|----|----|-----|-----|-----|-----|-----|
| DLL | DS | QFC | AL0 | AL1 | AL2 | OIA | WR0 | WR1 | WR2 | 0 | 0 | 0 | 1 | 0 |

FIG. 17

| A0 | DLL |
|----|-----|
| 0 | Enable |
| 1 | Disable |

FIG. 18

| A1 | Drive Strength |
|----|----------------|
| 0 | Normal |
| 1 | Weak |

FIG. 19

| A2 | QFC |
|----|-----|
| 0 | Disable |
| 1 | Enable |

FIG. 20

| A5-A3 | Additive Latency |
|-------|------------------|
| 000 | 0 (default) |
| 001 | 1 cycle |
| 010 | 2 cycles |
| 011 | 3 cycles |
| 100 | 4 cycles |
| others | reserved |

FIG. 21

| A6 | Output Impedance Adjust |
|----|-------------------------|
| 0 | Disable (default) |
| 1 | Enable |

FIG. 22

| A9-A7 | tWR |
|-------|-----|
| 000 | 2 cycles |
| 001 | 3 cycles |
| 010 | 4 cycles |
| 011 | 5 cycles |
| 100 | 6 cycles |
| others | reserved |

FIG. 23

| BA1-BA0 | An-A10 | A9-A0 | Operating Mode |
|---------|--------|-------|----------------|
| 01 | 0 | Valid | Normal Operation |
| 01 | - | | All other states reserved |

FIG. 24

| Clock Period | tDAL=32 ns | |
|---|---|---|
| | tWR (clocks/ns) | tRP (clocks/ns) |
| 2.5 | 5 / 12.5ns | 8 / 20ns |
| 3.0 | 4 / 12ns | 7 / 21ns |
| 3.5 | 4 / 14ns | 6 / 21ns |
| 4.0 | 3 / 12ns | 5 / 20ns |
| 4.5 | 3 / 13.5ns | 5 / 22.5ns |
| 5.0 | 3 / 15ns | 4 / 20ns |
| 5.5 | 3 / 16.5ns | 4 / 22ns |
| 6.0 | 2 / 12ns | 4 / 24ns |
| 6.5 | 2 / 13ns | 4 / 26ns |
| 7.0 | 2 / 14ns | 3 / 21ns |

FIG. 26

CLOCKED MEMORY DEVICE THAT INCLUDES A PROGRAMMING MECHANISM FOR SETTING WRITE RECOVERY TIME AS A FUNCTION OF THE INPUT CLOCK

BACKGROUND OF THE INVENTION

1. Technical Field

This invention generally relates to memory devices, and more specifically relates to clocked memory devices.

2. Background Art

The proliferation of modern electronics into our everyday life is due in large part to the existence, functionality and relatively low cost of advanced integrated circuits. One important component in many modern electronic systems is memory. Various types of memory devices have been developed. Static Random Access Memory (SRAM) is a type of memory device that retains its memory contents as long as the device has power without the need for refreshing the memory. Dynamic Random Access Memory (DRAM) is a type of memory device that must be continually refreshed in order for its contents to be maintained. The support circuitry for DRAMs is thus more complex than for SRAMs because the DRAM must be periodically refreshed. However, the advantage of DRAMs is the smaller size of each cell, making it possible to build DRAMs that have much higher memory density than is possible with SRAMs.

Several different types of DRAMs have been developed. The first DRAMs were asynchronous DRAMS that specified access time in nanoseconds (ns). This means that the appropriate address and control signals were applied to the DRAM, and the data was guaranteed to be present on the output data lines within the specified access time. Later, synchronous DRAMs (SDRAMs), a type of clocked memory device, were developed to use a clock input to synchronize the operations within the DRAM device. The result is higher data rate with access times specified in clock cycles. The first SDRAMs have become known as single data rate devices, because the data transfer occurs at a rate of one transfer per clock cycle. Newer devices are known as double data rate (DDR) devices because the data transfer occurs at a rate of two transfers per clock cycle (one on the rising edge of the clock, and one on the falling edge of the clock).

One important timing parameter for clocked memory devices such as SDRAMs is known as write recovery time, which is the time between when the last data bit is written to the device and when the device can go into its precharge operation. In the prior art, write recovery time is an asynchronous parameter that is set according to the anticipated operational conditions for the device. The write-recovery time is typically a hard-wired feature of an SDRAM design, and can be specified in a number of clock cycles or a timer delay value or a combination of both, but is typically specified in nanoseconds (ns).

As the speed of operation for SDRAMS has increased over time, problems with having a hardwired write recovery time have become apparent. Without a way to dynamically set write recovery time in a clocked memory device, these devices will not deliver adequate performance over a broad range of operating frequencies. As a result, device manufacturers will have to tune a clocked memory device and set its hard-wired write recovery time for a specific range of speeds, which may limit the frequency of operation of the clocked memory device.

DISCLOSURE OF INVENTION

According to the preferred embodiments, a clocked memory device includes a programming mechanism that allows the write recovery time during a command with auto precharge enabled to be dynamically set to some function of the input clock. In the preferred embodiments, the programming mechanism includes a control register with programmable bits that allows specifying the write recovery time according to the bit values written to the control register. For example, write recovery time could be specified as a whole or fractional number of clock cycles. By specifying the write recovery time as a function of the clock that may be dynamically set, the clocked memory device may be used at its highest performance capabilities over a wide range of operating frequencies.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and:

FIG. 2 is a table that shows write recovery time (tWR) and precharge time (tRP) for the timing diagram of FIG. 1 as the clock frequency varies from 7.0 to 15 ns when tDAL is specified as a fixed value of 5 clock cycles;

FIG. 6 is a table that shows write recovery time (tWR) and precharge time (tRP) when the write recovery time is fixed at one clock as shown in FIG. 5 as the clock frequency varies from 7.0 ns to 15 ns when tDAL is specified as a minimum time value in nanoseconds;

FIG. 8 is a table that shows write recovery time (tWR) and precharge time (tRP) when the write recovery time is specified as a fixed internal delay time as shown in FIG. 7 as the timer delay varies from 10 to 20 ns when tDAL is specified as a fixed time value in nanoseconds;

FIG. 11 is a block diagram showing a first suitable implementation of an extended mode register (EMRS) in accordance with the preferred embodiments for a DDR SDRAM;

FIGS. 12–16 are each block diagrams showing parameters in accordance with the preferred embodiments that may be programmed by writing values to the appropriate bits of the EMRS shown in FIG. 11;

FIG. 17 is a block diagram showing a second suitable implementation of an EMRS register in accordance with the preferred embodiments for a DDR II SDRAM;

FIGS. 18–24 are each block diagrams showing parameters in accordance with the preferred embodiments that may be programmed by writing values to the appropriate bits of the EMRS shown in FIG. 17;

FIG. 26 is a table that shows write recovery time (tWR) and precharge time (tRP) when the write recovery time may be dynamically set in the clocked memory as the clock frequency varies from 2.5 ns to 7.0 ns to illustrate the scalability of the solution of the preferred embodiments to faster clock speeds.

BEST MODE FOR CARRYING OUT THE INVENTION

The present invention relates to timing parameters in clocked memories, such as synchronous dynamic random access memory (SDRAM) devices. For those who are not familiar with clocked memory devices or SDRAMs, the brief overview below provides background information that will help the reader to understand the present invention.

1. Overview
Write Recovery Time in an SDRAM

Write recovery time in an SDRAM is the time between when the last data bit is written in an auto-precharge operation and the time that the SDRAM can go into its precharge operation. Precharge in an SDRAM can be performed in two different ways. The first way is manual precharge, where the memory controller that provides the refresh and other control functions for the SDRAM expressly determines when a precharge operation takes place. Write recovery time can be satisfied (although may not be optimized for performance) in the manual precharge case because the controller can simply wait an appropriate amount of time (i.e., write recovery time) before performing the manual precharge operation. The second way to perform a precharge operation in an SDRAM is to perform an auto-precharge command, which causes the precharge operation to begin automatically once an operation is complete. The problem addressed herein relates to the write recovery time after an auto-precharge operation in an SDRAM.

Write recovery time is currently specified as a period of time (usually in nanoseconds) that needs to be met by the memory controller to insure proper device operation. As a nanosecond value in a synchronous memory, the user of the component must convert the write recovery time to a number of clock cycles based on the frequency of operation in the circuit and round up to the appropriate value to insure that the minimum write recovery time is met. In the early days of SDR SDRAM, when the fastest cycle time was 10 ns, one cycle of write recovery used to be sufficient, and if it was not sufficient, often a manufacturer could pad the 10 ns write recovery time by a small amount, effectively borrowing from the precharge time by adding more delay on top of the 10 ns clock delay. However, as processes have improved, newer, faster parts have been developed that require more than one cycle of write recovery time. Because the SDRAM cannot accurately calculate a 15 ns delay across variations in process, voltage and temperature with an internal asynchronous timer, it is difficult to start the precharge operation at the appropriate time without introducing unwanted delay. In addition, this technique of borrowing nanoseconds from precharge to improve write recovery is no longer an option as both of these critical AC parameters have been significantly squeezed.

Figure 1:
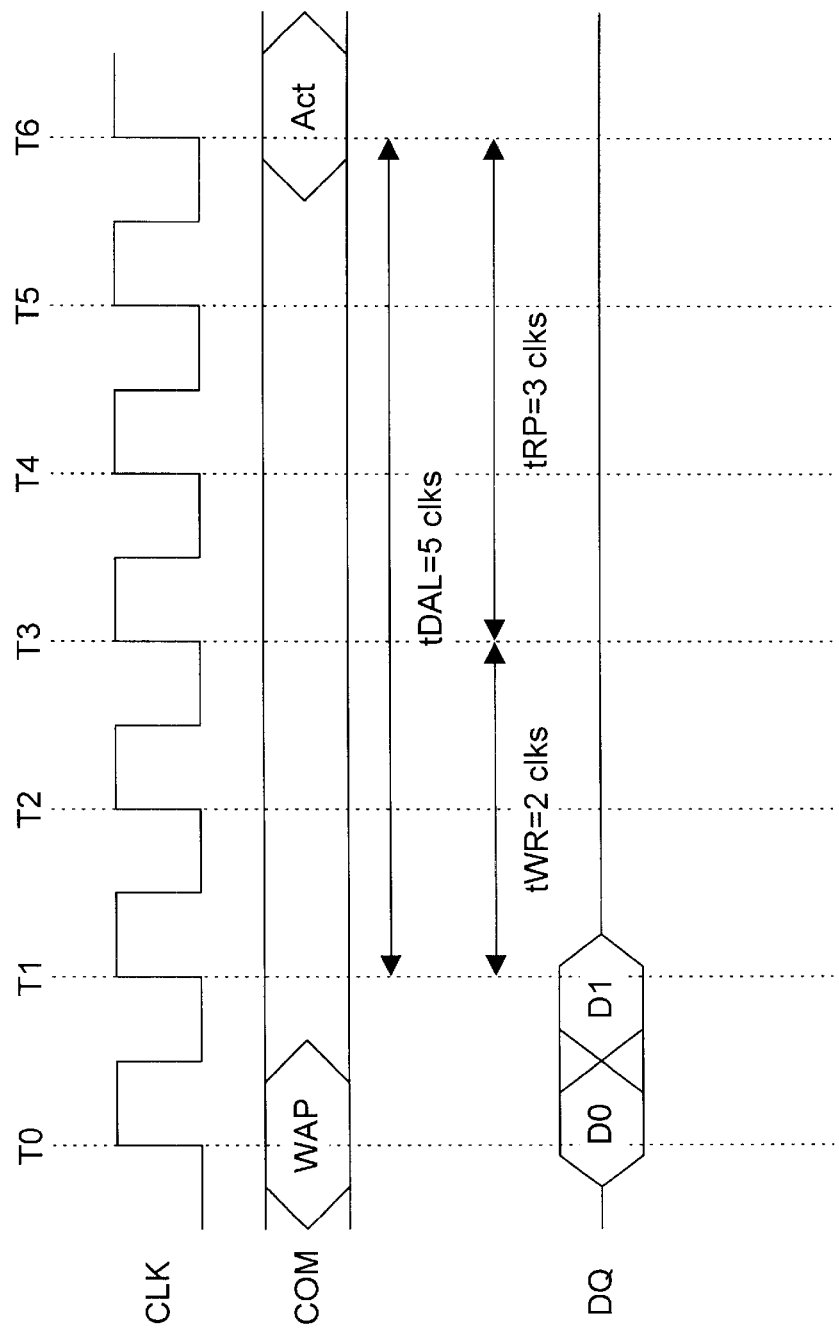
FIG. 1 is a timing diagram showing write recovery time in relation to other timing parameters for a single data rate (SDR) synchronous dynamic random access memory (SDRAM) device in accordance with the prior art.

There are two methods that are known in the art for addressing the problem of assuring that the minimum write recovery time is met. The first method simply makes the number of clocks required for write recovery to be greater than one. One example of such an implementation is shown in FIGS. 1 and 2. FIG. 1 is a timing diagram that shows write recovery time for a single data rate SDRAM that implements a synchronous writeback timer to begin the auto-precharge operation two cycles from the last data input, as is known in the prior art as a PC100 or PC133 SDR SDRAM. The top line in the timing diagram is the input clock (CLK) to the SDRAM. The next line shows when commands (COM) are issued to the SDRAM. The command at the left side of FIG. 1 is a WAP command, which stands for write with auto-precharge. We assume that the activate command (Act) on the right side of the COM line is an activate command for the same bank that was addressed by the WAP command. The bottom line shows the data on the data lines (DQ). In this specific example, we assume a burst length of two, and that a write command is issued on the rising edge of T0, with data D0 written on the rising edge of T0 and data D1 written on the rising edge of T1. The write recovery time is specified as tWR, and the precharge time is specified as tRP. Another timing parameter referred to as tDAL (time from last Data-in to Activate Latency) is the sum of tWR and tRP. For the specific prior art example in FIG. 1, we assume that the write recovery time is fixed at two clock cycles, that the precharge time is fixed at three clock cycles, resulting in tDAL being fixed at five clock cycles.

Figure 3:
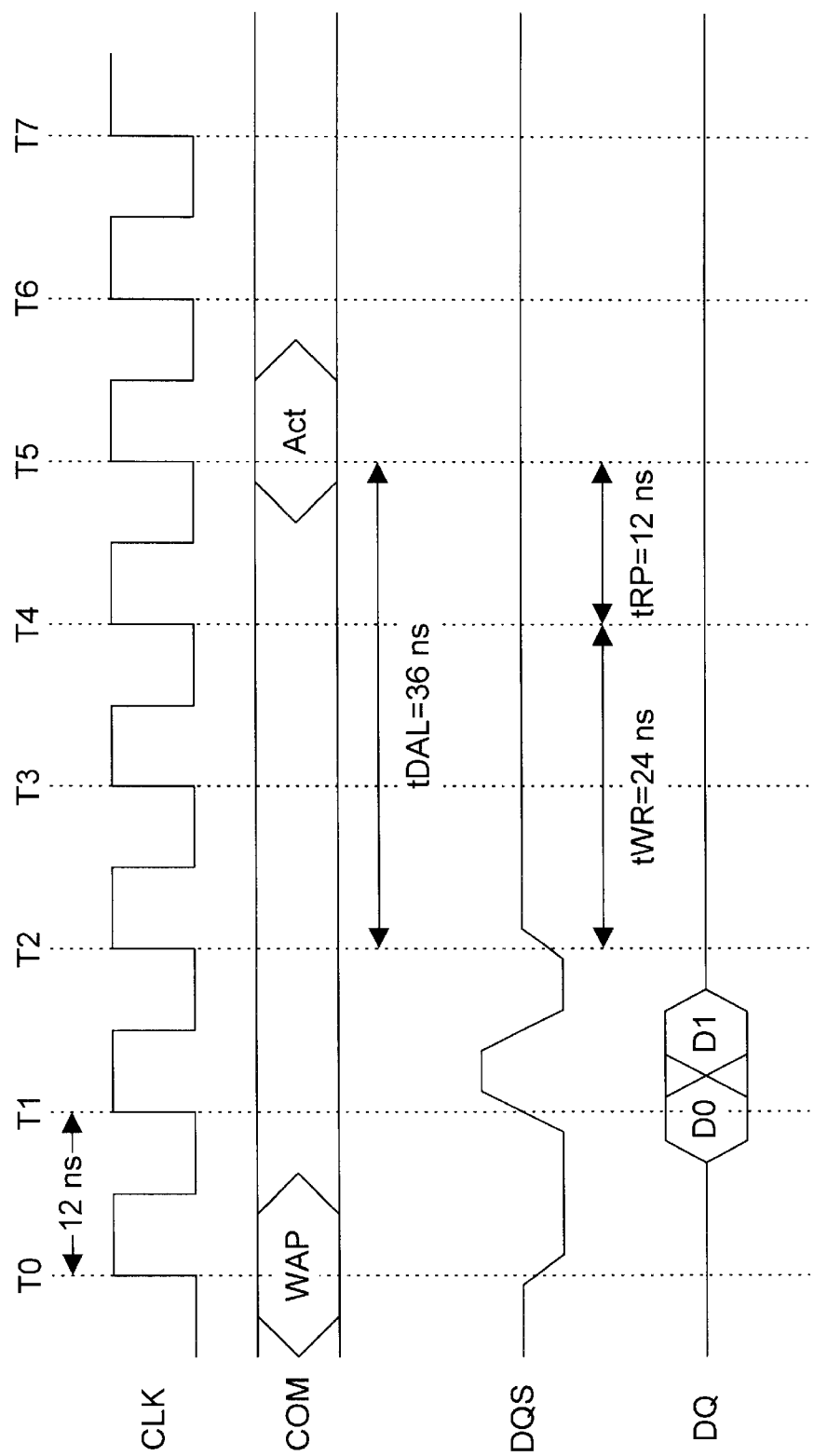
FIG. 3 is a timing diagram showing write recovery time in relation to other timing parameters for a double data rate (DDR) SDRAM device when the write recovery time is fixed at two clock cycles in accordance with the prior art.

The chart in FIG. 2 shows the write recovery time and precharge time for the SDRAM device represented by the timing diagram of FIG. 1 for a variety of different clock frequencies. Because the write recovery time is specified as a fixed value of two clock cycles, the write recovery time will always be twice the clock period. Similarly, because the precharge time is specified as a fixed value of three clock cycles, it will always be three times the clock period. While this approach of fixing the write recovery time to two cycles works for the frequency ranges shown in FIG. 2, it does so at the expense of penalizing parts that run at lower frequencies that could take advantage of fewer clocks because this approach provides no way to alter the internal control within the SDRAM. These parts that require two cycles of write recovery time cannot be used in systems that took advantage of the original one clock specification for write recovery because the tDAL parameter which represents the sum total of write recovery tWR and precharge time tRP together would result in precharge time being violated because these parts would always wait 2, 3, 4 or more cycles before issuing the precharge command internally. This would result in an inadequate number of clocks and therefore ns to satisfy the precharge time requirements of the SDRAM. This problem is illustrated in FIGS. 3 and 4.

Double data rate (DDR) SDRAMs typically specify a minimum value for tWR and tRP, resulting in a minimum combined specification for tDAL. We assume for the example in FIGS. 3 and 4 that precharge time tRP must be at least 15 ns. A timing diagram for a known PC200 DDR SDRAM is shown in FIG. 3. Note that the double data rate comes from data D0 and data D1 both being written during T1. Note that the data strobe (DQS) signal is used to strobe the data into the DDR SDRAM, with D0 being strobed in on the rising edge of DQS and D1 being strobed in on the falling edge of DQS. With the example in FIG. 3 that has a clock period of 12 ns, a two cycle writeback timer means that the write recovery time will be a fixed 24 ns. The precharge time tRP is typically a multiple of the input clock. Thus, we see in the timing diagram of FIG. 3 that with tDAL specified as a minimum of 35 ns, a period of three clocks equals 36 ns, which meets the minimum specification for tDAL. However, with a two cycle writeback timer taking up 24 ns of the 36 ns total, this leaves only 12 ns for the precharge operation. This 12 ns precharge time does not meet the specified 15 ns minimum specified time for tRP.

Figure 4:
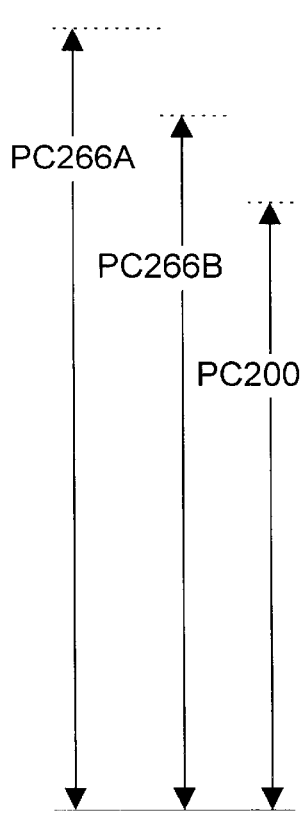
FIG. 4 is a table that shows write recovery time (tWR) and precharge time (tRP) when the write recovery time is fixed at two clock cycles as shown in FIG. 4 as the clock frequency varies from 7.0 ns to 15 ns when tDAL is specified as a minimum time value in nanoseconds

The problem with specifying a two cycle writeback timer in conjunction with a fixed time value for tDAL is graphically illustrated in the table in FIG. 4. Note that the value for the precharge time is adjusted to an appropriate multiple of clock cycles that will satisfy the overall total tDAL after subtracting the write recovery time tWR. Thus, with a clock period of 7.0, tWR=14 ns, and tDAL must be more than 35 ns, so three clock cycles are selected for tRP to give 21 ns of precharge time. Similarly, tRP is three clock cycles for clock periods of 7.5 ns and 8.0 ns. At a clock period of 10 ns, three cycles of precharge are no longer required to meet the 35 ns specification for minimum tDAL, so tRP may be reduced to two cycles, or 20 ns. Likewise, for a clock period of 11 ns, tRP is 22 ns, or two cycles. Note, however, that when the clock period equals 12 ns (as shown in FIG. 3), tRP may be reduced to one clock cycle and still satisfy the tDAL specification. However, the tRP specification requires that tRP be a minimum of 15 ns. The value of 12 ns for tRP when the clock period is 12 ns violates this requirement. Similarly, the values of tRP at clock periods of 13 ns and 14 ns also result in a tRP that is less than the specified 15 ns minimum. Note that when the clock period equals 15 ns, tRP is one cycle or 15 ns, which again satisfies the 15 ns minimum. Specifying tWR as a fixed two clocks and specifying tDAL as a minimum of 35 ns thus results in satisfactory performance for the clock periods of 7.0, 7.5, 8.0, 10, 11, and 15. However, for the clock periods of 12, 13 and 14, the resulting tRP is less than the 15 ns minimum, resulting in potential yield loss for the SDRAM depending on the intended speed of operation. This violation of the precharge time tRP is shown in FIG. 4 by an asterisk following the values that are less than 15 ns. Having a part that functions correctly at clock periods of 7.0, 7.5, 8.0, 10, 11, and 15 ns, but does not function at clock periods of 12, 13 and 14 ns is not a desirable result, because manufacturers will now have to specify different speed ranges for different parts depending on how the write recovery time and tDAL are specified. It would be very desirable to have a single part that would meet the applicable timing parameters for write recovery time tWR and precharge time tRP over a wide range of operating frequencies, but the prior art offers no such device.

Figure 5:
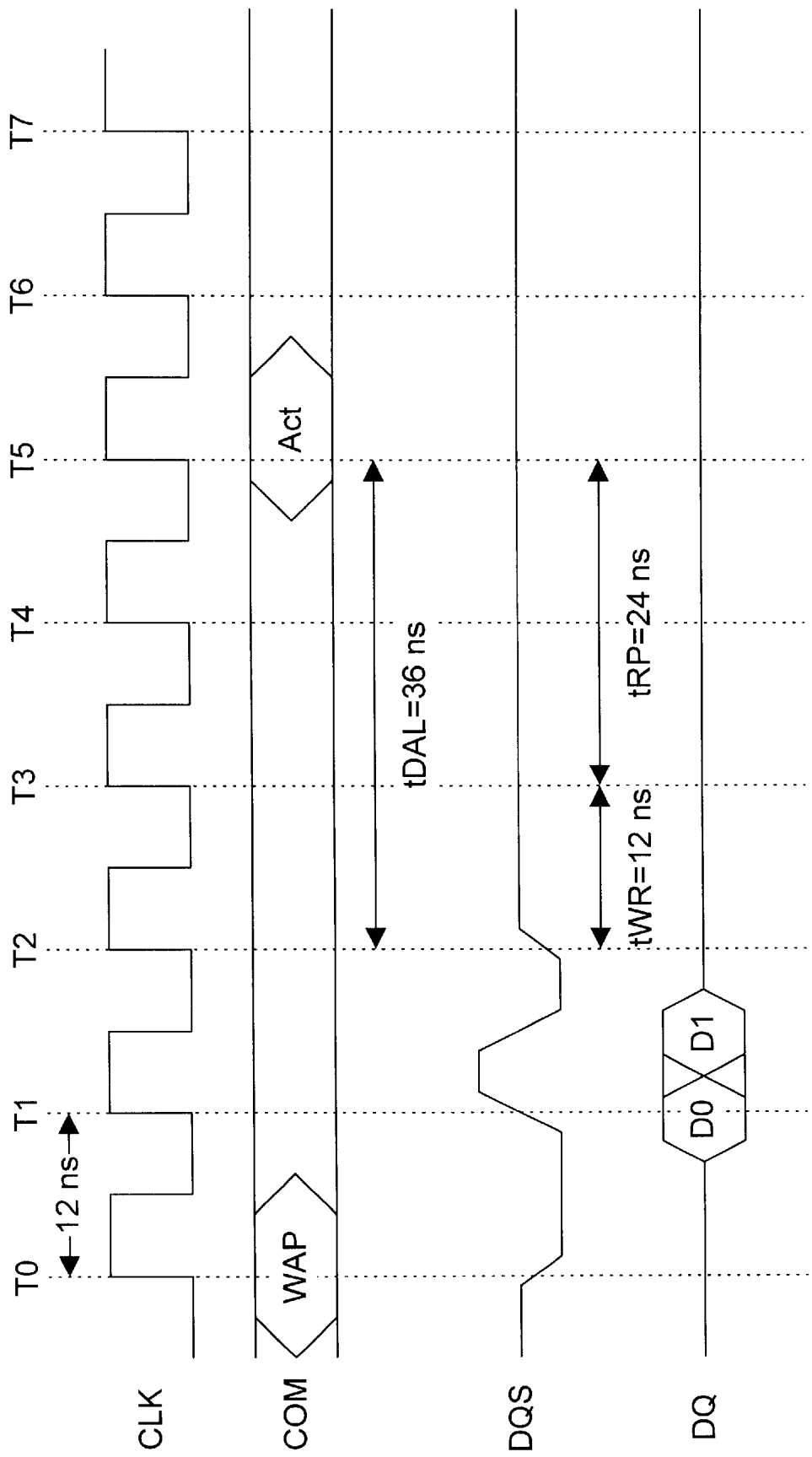
FIG. 5 is a timing diagram showing write recovery time in relation to other timing parameters for a DDR SDRAM device when the write recovery time is fixed at one clock in accordance with the prior art.

If the write recovery time is reduced to a single cycle in an effort to satisfy the minimum specified precharge time tRP, the result is a violation of write recovery time at several frequencies, as shown in FIGS. 5 and 6. FIG. 5 is identical to FIG. 3, except that tWR has been reduced from two clock cycles to a single clock cycle. The result is that the precharge time is correspondingly increased. We assume that write recovery time is specified as a minimum of one clock cycle, but cannot be less than 15 ns. However, as shown in FIG. 6, this write recovery time that is a minimum of 15 ns is violated for clock periods 7.0 ns through 14 ns, as shown by the tWR values being followed by an asterisk. The SDRAM that has a single clock writeback timer thus will only work at slower clock frequencies where the clock period is 15 ns or greater. While reducing tWR to a single clock cycle alleviated all problems with tRP, it generated a new crop of problems with tWR.

Figure 7:
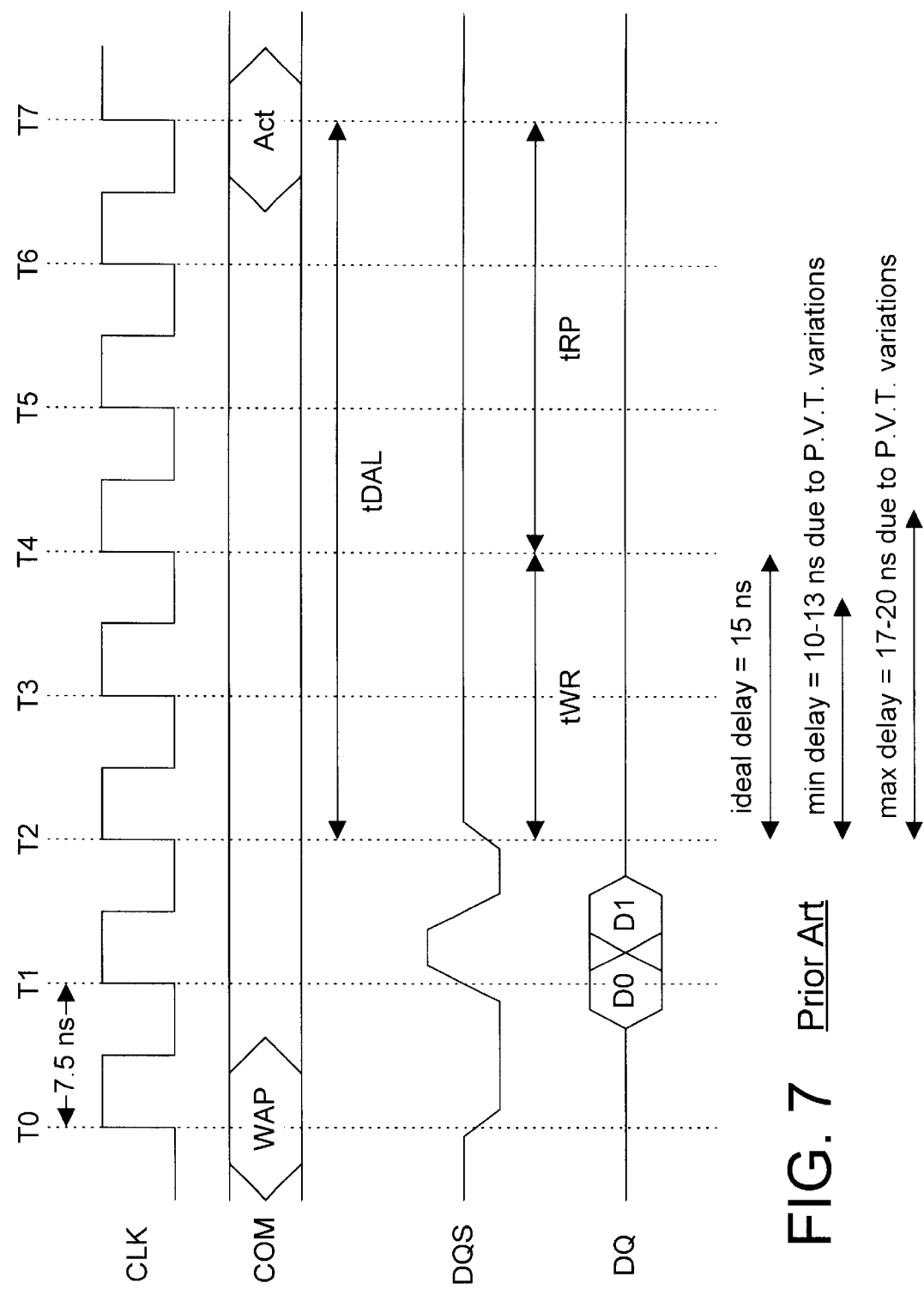
FIG. 7 is a timing diagram showing write recovery time in relation to other timing parameters for a DDR SDRAM device when the write recovery time is set to a fixed internal delay time in nanoseconds in accordance with the prior art.
Figure 9:
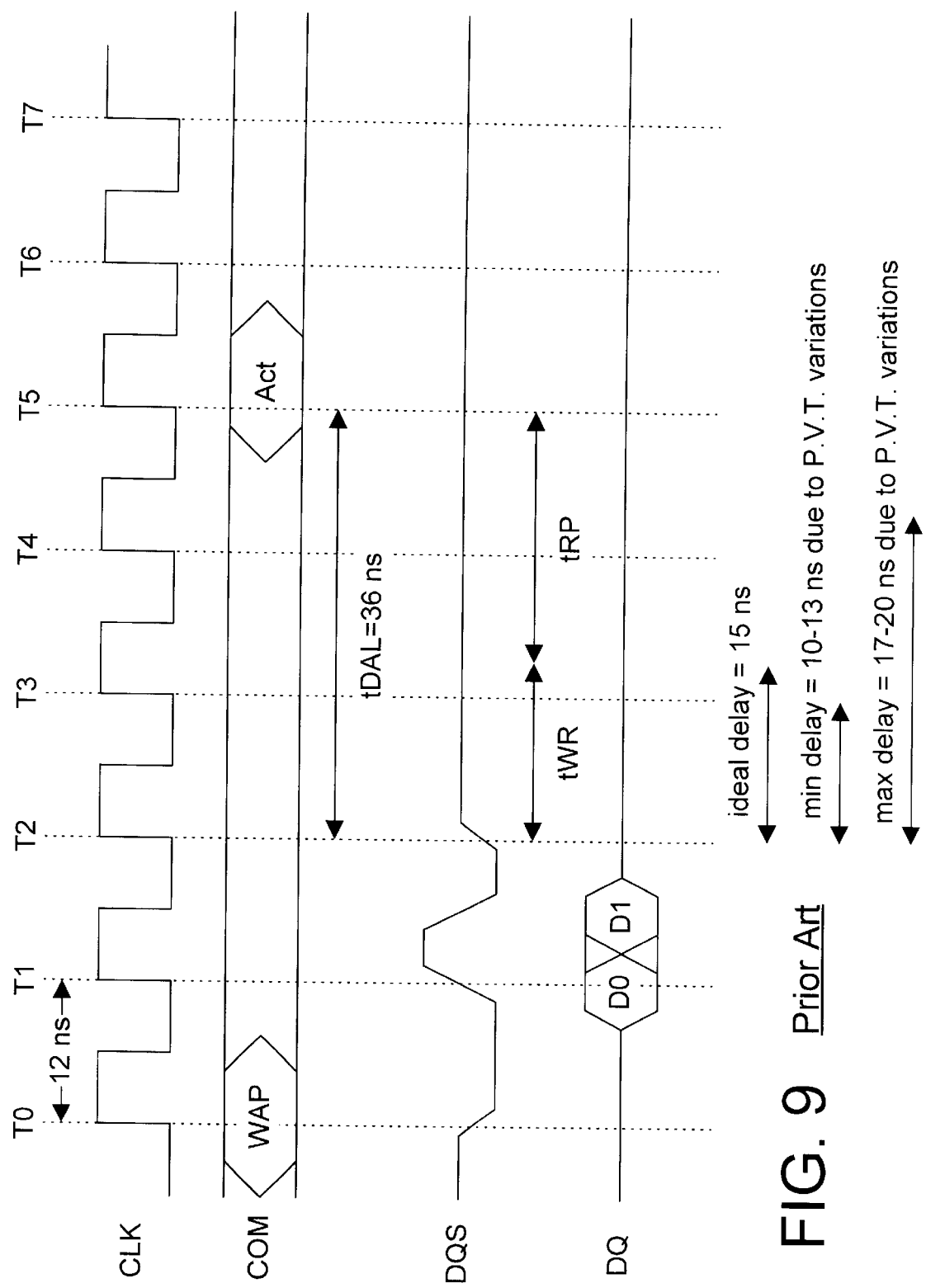
FIG. 9 is a timing diagram showing write recovery time in relation to other timing parameters for a DDR SDRAM device when the write recovery time is set to a fixed internal delay time, and when the SDRAM is operated at a slower clock speed than shown in FIG.7 in accordance with the prior art.

The second known method for bridging the gap between systems that needed one cycle of write recovery while supporting those that ran fast enough to need two cycles of write recovery is to design a timer for the write recovery time that always produces a write recovery delay of more than one clock cycle. This approach is illustrated in FIGS. 7–9. In the timing diagram of FIG. 7, tWR is a function of an on-chip timer that has a nominal value of 15 ns. However, due to process, voltage and temperature variations, the actual minimum delay for tWR can be from 10–13 ns, while the actual maximum delay could be from 17–20 ns, as shown at the bottom of the timing diagram of FIG. 7. The result of this variability is shown in the chart in FIG. 8. With tWR at its minimum extremes of 10 ns to 14 ns, tWR is pinched as shown by the asterisks, and yield loss results. Similarly, with tWR at its maximum extremes of 15 ns to 20 ns, and with tDAL specified as a minimum of 35 ns, the value for tRP is reduced in FIG. 8, and yield loss may occur for some manufacturers.

FIG. 9 shows a timing diagram for the same delay for tWR used in FIG. 7 when the clock period is increased to 12 ns. As the frequency slows down, the greater the delay for tWR is compared to the total specified tDAL, which causes the minimum for tRP to be pinched at these lower frequencies, as shown in FIG. 8.

The memory industry has thus made different attempts to specify write recovery time tWR and tDAL in ways that will improve performance at certain frequencies, but these attempts have made the design less usable over a wide range of operating frequencies. This shows a long-felt need in the industry for a solution that will solve the problem in specifying write recovery time in a manner that will provide operability over a large range of operating frequencies, and which is scalable to future designs as the operating frequency of clocked memories continues to increase in the future. The preferred embodiments of the present invention meet this long-felt need by providing a simple yet elegant solution that allows dynamically specifying tWR as a function of the input clock, preferably as a selected number of cycles or fractional cycles of the input clock.

2. Detailed Description

According to preferred embodiments of the present invention, a clocked memory device includes a programming mechanism that allows dynamically setting the write recovery time of the clocked memory device at run-time. The term "run-time" herein is used to denote any time when the clocked memory device is powered up in a target system where it is to be used. The preferred embodiments thus extend to any programming mechanism that allows setting or changing the write recovery time of a clocked memory dynamically (i.e., as the clocked memory is operating).

One specific embodiment of the invention uses a control register that includes one or more bits that allow the write recovery time for the device to be dynamically set as a function of clock frequency, rather than being hard-wired as is known in the art. The write recovery time is preferably set as a number of whole or fractional clock cycles of the input clock to the device. By allowing the write recovery time to be dynamically set, a system in which the device is used may configure the device for proper operation according to the clock speed that the system supplies to the device. The preferred embodiments thus allow a single design to be usable in a broad range of operating frequencies without impacting the yield of the device.

Figure 10:
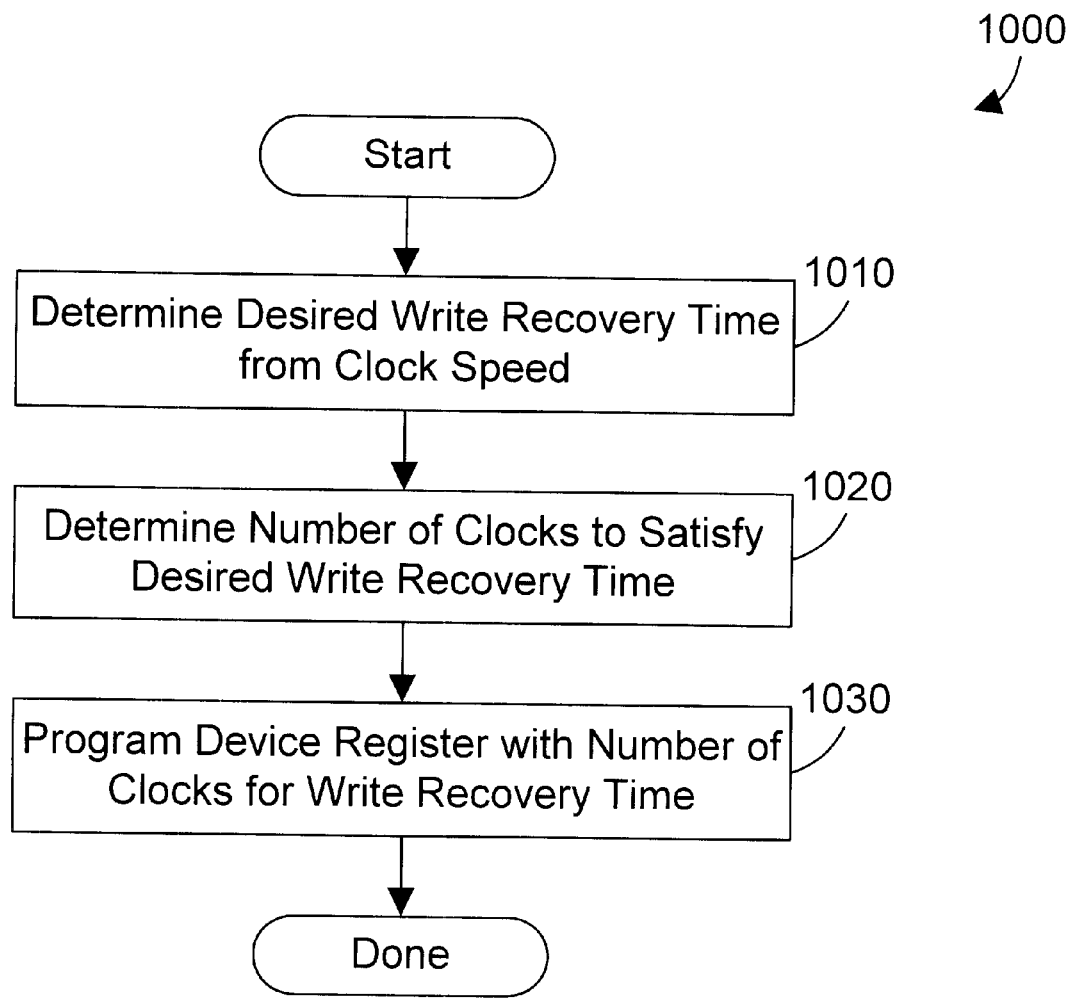
FIG. 10 is a flow diagram of a method for dynamically setting write recovery time in a clocked memory device in accordance with the preferred embodiments.

Referring to FIG. 10, a method 1000 in accordance with the preferred embodiments begins by determining the desired write recovery time in nanoseconds from the clock speed at which the device will actually run (step 1010). Next, the time in nanoseconds is converted to a number of clocks that are required to satisfy the desired write recovery time (step 1020). The number of clocks are selected by determining how many clock cycles are required to include the desired write recovery time within the window defined by the last clock cycle. Finally, once the desired number of clock cycles for write recovery time has been determined in step 1020, appropriate bits in a control register within the device are programmed to provide the number of clock cycles for write recovery (step 1030). In this manner, method 1000 provides a simple and flexible way to dynamically set the write recovery time in a clocked memory device according to its anticipated operational frequency.

As explained above with respect to step 1030 of FIG. 10, the appropriate number of clocks for the write recovery time may be set by writing to appropriate bits in a control register. A first suitable implementation in accordance with the preferred embodiments uses undefined bits in the extended mode register (EMRS) of a DDR SDRAM to define the number of cycles for tWR. Referring to FIG. 11, an extended mode register EMRS in accordance with the preferred embodiments includes prior art definitions for A0, A1, A2, BA0, and BA1, and also includes new definitions for A3 and A4 that allow dynamically setting the write recovery time as a function of the input clock of the SDRAM device. FIG. 12 shows the values for enabling and disabling DLL, which is the delay lock loop that controls the timing of the presentation of data on the output bus. FIG. 13 shows the values for adjusting the drive strength of the SDRAM device. FIG. 14 shows the values for enabling and disabling QFC, which stands for output (typically denoted Q) FET Control. FIG. 15 shows suitable values in accordance with the preferred embodiments for specifying write recovery time tWR as a number of cycles of the input clock to the SDRAM device. If A4 and A3 are both zero, the write recovery time tWR is set to 2 cycles. If A4 is zero and A3 is one, the write recovery time tWR is set to 3 cycles. If A4 is set to one and A3 is set to zero, the write recovery time tWR is set to 4 cycles. If A4 and A3 are both one, the write recovery time tWR is set to 5 cycles. FIG. 16 shows that when BA1 is zero, BA0 is one, and all bits above A4 in the EMRS are zero, the values in A4–A0 are valid, which defines a normal mode of operation. All other states are reserved. Note that the number of address bits that are zero decreases from An–A3 in the prior art to An–A5 for the invention because the invention uses two more bits than the prior art.

Another way to set write recovery time dynamically using the extended mode register EMRS is shown in FIGS. 17–24 for a DDR II SDRAM. Note that the specification for DDR II SDRAMs is currently being defined, so the position and function of the bits shown in FIG. 17 may vary from the final specification once approved. The EMRS in FIG. 17 includes the same prior art parameters defined in A0, A1, A2, BA0 and BA1. However, A5–A3 are new bits that define an additive latency for the SDRAM. A6 is a new bit that allows adjusting the output impedance of the SDRAM. A9–A7 are bits that are used to dynamically set the write recovery time of the SDRAM. FIGS. 18, 19 and 20 are the same as corresponding FIGS. 12, 13 and 14, because these are prior art parameters that are defined in known extended mode registers. FIG. 21 shows a way to dynamically set the additive latency for the SDRAM device by writing appropriate values to A5–A3. If A5–A3=000, the additive latency is zero. Appropriately setting A5–A3 results in setting the additive latency to 1 cycle, 2 cycles, 3 cycles, or 4 cycles, as shown in FIG. 21. Additive latency is a term used in proposed DDR II SDRAM specifications to describe a user programmable latency until a "posted" read or write command may be issued in the device.

FIG. 22 shows values that may be written to bit A6 to adjust the output impedance of the SDRAM device. Like additive latency discussed above, providing a bit to adjust the output impedance is another feature that has been proposed for DDR II SDRAMs. FIG. 23 shows the various values that may be written to A9–A7 to set the write recovery time tWR to a selected value from 2 to 6 cycles. FIG. 24 shows the configuration of values in the EMRS that results in a valid combination that should be expected for normal operation, while all other states are reserved.

Figure 25:
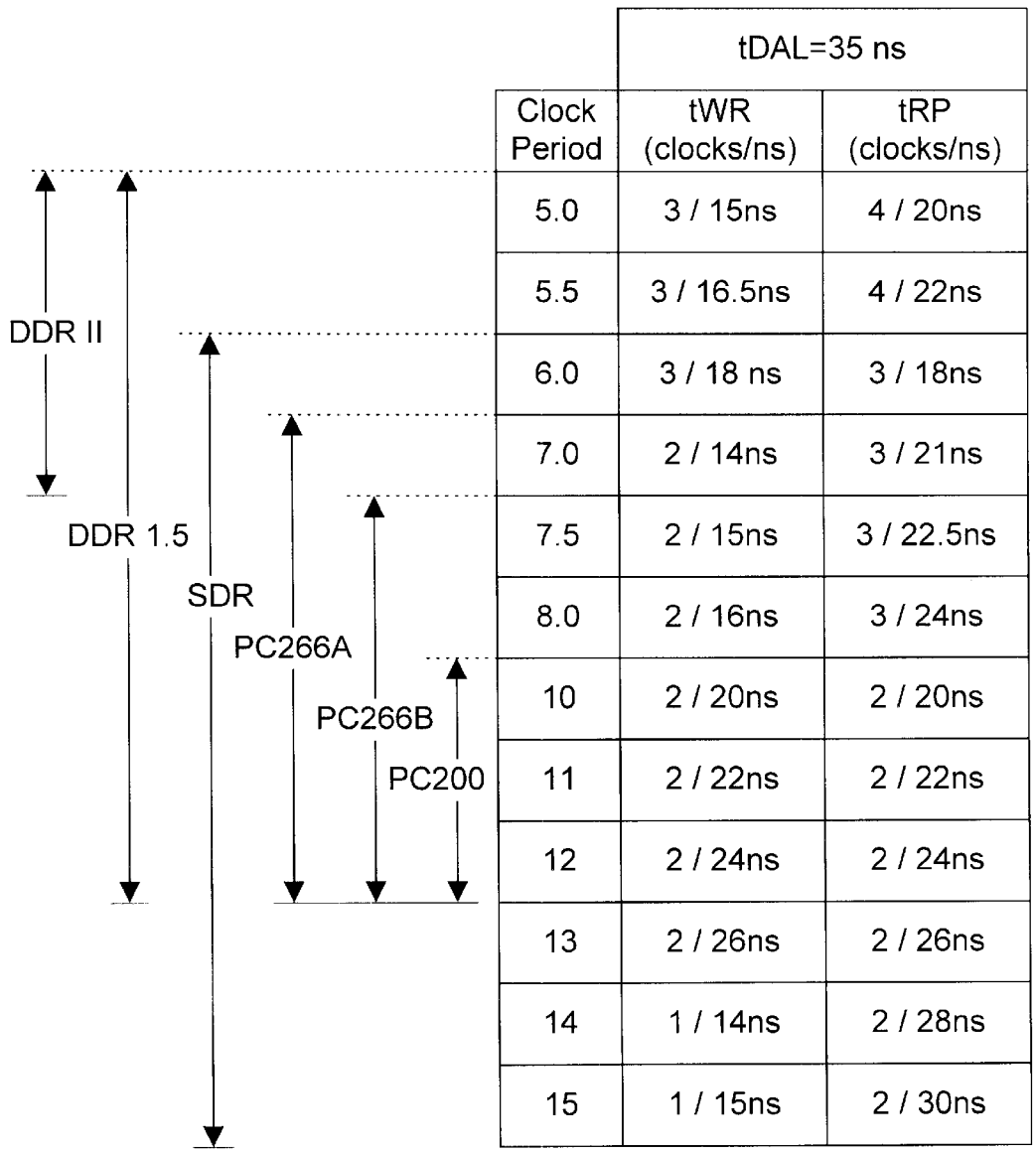
FIG. 25 is a table that shows write recovery time (tWR) and precharge time (tRP) when the write recovery time may be dynamically set in various types of clocked memories as the clock frequency varies from 5.0 ns to 15 ns.

By setting the write recovery time to a desired number of clock cycles by writing to the appropriate bits in a control register in the SDRAM, one SDRAM may be used in a wide range of different operating frequencies. We assume that tDAL is still specified at a value of 35 ns. Referring to the chart in FIG. 25, setting tWR to an appropriate number of clock cycles can result in a device that satisfies all of the operating specifications shown to the left of the table if we assume that the write recovery time can be reduced from 15 ns to 14 ns due to yield learning improvements. By specifying tWR as a selected number of cycles, and tDAL as a fixed time (e.g., 35 ns), the resulting number of cycles and corresponding time for precharge time tRP is shown. We see that by judiciously selecting write recovery time tWR as a selected number of clock cycles, we can assure proper operation over a wide range of operating frequencies. FIG. 26 further illustrates how dynamically specifying write recovery time in a clocked memory device will allow the device to continue to be used as the operating frequencies increase. At a clock period of 2.5 ns, five clock cycles are needed for write recovery time tWR, and eight clock cycles are needed for precharge time tRP, and the device will still operate correctly with these values assuming the write recovery time can be further decreased to 12 ns due to yield learning improvements. In addition, if a part cannot run with a 2.5 ns clock period but can run at 5.5 ns clock period, the write recovery time tWR can be set to 3 cycles (see FIG. 26), and the device can thus be down-sorted to a lesser frequency range rather than being discarded. In this way devices may be sorted according to their operating frequencies, thereby maximizing yield. Note that the values of tWR and tRP could be further tuned in FIGS. 25 and 26 to satisfy any minimum value for tWR (such as those that do not assume yield learning improvements) by specifying tWR in fractional clock cycles in accordance with the preferred embodiments.

One attraction of dynamically setting the write recovery time for an SDRAM device using unused bits within existing control registers is that these control registers must be configured when the device is initially powered up, and the step of writing some new bits that are already present in an existing register thus does not take any additional overhead. The preferred embodiments thus provide a simple yet powerful way to make an SDRAM device nearly universal over a wide range of operating frequencies, depending on the number of cycles that are programmed in the device for the write recovery time tWR.

Providing a control register with bits that allow dynamically setting the write recovery time would not have been obvious to one of ordinary skill in the art. The Overview section above clearly defines the problem, and discussed two prior art approaches to solving the problem. SDRAMs have existed since about 1994, and while there are various different semiconductor devices that allow programming different operational parameters for the device, nowhere does the prior art teach or suggest providing a programmable feature for write recovery time on an SDRAM device. The combination of long-felt need in the industry with the simple solution that allows scalability both forward and backward results in an SDRAM device that would not have been obvious to one of ordinary skill in the art at the time the invention was made.

The present invention as described with reference to the preferred embodiments herein provides significant improvements over the prior art. By defining bits in a control register in a clocked memory device that determine the write recovery time of the device, the device can be programmed dynamically to function correctly over a broad range of operating frequencies. Providing a single clocked memory device that is suitable for many different operating frequencies results in fewer part types that the manufacturer needs to make and fewer part types that a consumer of the devices needs to stock, resulting in greater efficiency and hence more profits compared to prior art approaches that would require several different hard-wired designs to operate across the same range of operating speeds.

One skilled in the art will appreciate that many variations are possible within the scope of the present invention. Thus, while the invention has been particularly shown and described with reference to preferred embodiments thereof, it will be understood by those skilled in the art that these and other changes in form and details may be made therein without departing from the spirit and scope of the invention. For example, SDRAM is referred to herein as one specific example of a clocked memory. However, the preferred embodiments extend to any and all memory devices that are synchronized using an input clock signal. In addition, while the preferred embodiments are discussed above with respect to specifying write recovery time in whole clock cycles, the preferred embodiments expressly extend to specifying write recovery time in fractional clock cycles as well. The term "fractional" as used herein is used in a broad sense to mean any portion of a clock cycle other than a whole clock cycle, whether specified using a fraction, decimal, or other representation. In addition, the term "programming mechanism" has been described in the preferred embodiments herein as bits in a control register that allow specifying the write recovery time as a function of the input clock. Note, however, that the preferred embodiments expressly extend to any mechanism for dynamically setting the write recovery time of a clocked memory device, regardless of the specific mechanism used.

We claim:

1. A clocked memory device comprising:
   a plurality of memory cells;
   a clock input that provides a timing signal for accessing the plurality of memory cells; and
   a programming mechanism that allows dynamically specifying write recovery time for the clocked memory device at run-time.

2. The clocked memory device of claim 1 wherein the programming mechanism comprises at least one control register that includes at least one bit for specifying write recovery time for the clocked memory device as a function of the clock input.

3. The clocked memory device of claim 2 wherein the at least one control register comprises one register with a plurality of bits that specify write recovery time for the clocked memory device.

4. The clocked memory device of claim 2 wherein the at least one control register comprises an extended mode register with a plurality of bits that specify write recovery time for the clocked memory device.

5. The clocked memory device of claim 1 wherein the clocked memory device comprises a synchronous dynamic random access memory device.

6. The clocked memory device of claim 1 wherein the write recovery time is specified as a function of the clock input.

7. The clocked memory device of claim 1 wherein the write recovery time is specified as a number of cycles of the clock input.

8. The clocked memory device of claim 1 wherein the write recovery time is specified as a fractional number of cycles of the clock input.

9. The clocked memory device of claim 1 wherein the write recovery time comprises the time between when a last data bit is written to the clocked memory device and when the clocked memory device can begin a precharge operation.

10. A method for determining operational characteristics of a clocked memory device, the method comprising the steps of:
    (1) providing within the clocked memory device a programming mechanism that allows dynamically specifying write recovery time for the clocked memory device at run-time; and
    (2) specifying at run-time write recovery time for the clocked memory device using the programming mechanism.

11. The method of claim 10 wherein step (1) comprises the step of providing at least one control register that includes at least one bit for specifying write recovery time for the clocked memory device, and wherein step (2) comprises the step of writing to the at least one bit in the at least one control register to specify write recovery time for the clocked memory device.

12. The method of claim 11 wherein step (1) comprises the step of providing an extended mode register that includes at least one bit for specifying write recovery time for the clocked memory device, and wherein step (2) comprises the step of writing to the extended mode register.

13. The method of claim 11 further comprising the steps of:
    determining a desired write recovery time from a clock speed of operation for the clocked memory device;
    determining from the desired write recovery time a number of clock cycles required to satisfy the desired write recovery time; and
    step (2) comprising the step of writing to the at least one bit in the at least one control register to specify the number of clock cycles for the write recovery time for the clocked memory device.

14. The method of claim 10 wherein the clocked memory device comprises a synchronous dynamic random access memory device.

15. The method of claim 10 wherein the write recovery time is specified as a function of a clock input to the clocked memory device.

16. The method of claim 10 wherein the write recovery time is specified as a number of cycles of a clock input to the clocked memory device.

17. The method of claim 10 wherein the write recovery time is specified as a fractional number of cycles of a clock input to the clocked memory device.

18. The method of claim 10 wherein the write recovery time comprises the time between when a last data bit is written to the clocked memory device and when the clocked memory device can begin a precharge operation.

19. The method of claim 10 further comprising the step of specifying a minimum value for the sum of write recovery time and precharge time in the clocked memory device, and selecting the write recovery time as a function of the specified minimum value.

* * * * *